US011094365B1

(12) United States Patent
Jang et al.

(10) Patent No.: US 11,094,365 B1
(45) Date of Patent: Aug. 17, 2021

(54) SYSTEM AND METHOD FOR REFRESHING DATA FOR INTEGRITY PROTECTION AT A THERMAL EXCURSION EVENT

(71) Applicant: DELL PRODUCTS, LP, Round Rock, TX (US)

(72) Inventors: Young Hwan Jang, Gwangju-si (KR); Lip Vui Kan, Hillbrooks (SG)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/821,206

(22) Filed: Mar. 17, 2020

(51) Int. Cl.

| | |
|---|---|
| ***G11C 11/406*** | (2006.01) |
| ***G11C 11/4093*** | (2006.01) |
| ***G06F 9/30*** | (2018.01) |
| ***G06F 11/30*** | (2006.01) |
| ***G06F 12/02*** | (2006.01) |
| ***G06F 12/0895*** | (2016.01) |
| ***G06F 11/07*** | (2006.01) |

(52) U.S. Cl.
CPC .... *G11C 11/40626* (2013.01); *G06F 9/30047* (2013.01); *G06F 11/076* (2013.01); *G06F 11/3037* (2013.01); *G06F 12/0253* (2013.01); *G06F 12/0895* (2013.01); *G11C 11/4093* (2013.01); *G11C 11/40615* (2013.01)

(58) Field of Classification Search
CPC .......... G11C 11/40626; G11C 11/4093; G11C 11/40615; G06F 11/076; G06F 9/30047; G06F 12/0895; G06F 12/0253; G06F 11/3037
See application file for complete search history.

(56) References Cited

U.S. PATENT DOCUMENTS

| | | | | |
|---|---|---|---|---|
| 9,625,974 | B2 | 4/2017 | Bailey et al. | |
| 10,503,635 | B2 | 12/2019 | Kan et al. | |
| 2013/0094288 | A1* | 4/2013 | Patapoutian | G11C 16/3454 365/185.03 |
| 2017/0255403 | A1* | 9/2017 | Sharon | G11C 11/5642 |

* cited by examiner

*Primary Examiner* — Jay W. Radke
(74) *Attorney, Agent, or Firm* — Larson Newman, LLP

(57) ABSTRACT

An information handling system includes a memory array and a memory controller. The memory array stores data within the information handling system. The memory controller writes the data to the memory array. The memory controller also determines whether a temperature of the memory array is above a threshold temperature. The memory controller tags a plurality of memory locations within the memory array written with data while the temperature is above the threshold temperature. While a refresh operation is being executed, the memory controller determines whether the temperature of the memory array is below the threshold temperature. In response to the temperature of the memory array being below the threshold temperature and while the refresh operation is being executed, the memory controller rewrites the data in the tagged memory locations within the memory array.

18 Claims, 7 Drawing Sheets

SYSTEM AND METHOD FOR REFRESHING DATA FOR INTEGRITY PROTECTION AT A THERMAL EXCURSION EVENT

FIELD OF THE DISCLOSURE

The present disclosure generally relates to information handling systems, and more particularly relates to refreshing data for integrity protection at a thermal excursion event.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements may vary between different applications. Thus information handling systems may also vary regarding what information is handled, how the information is handled, how much information is processed, stored, or communicated, and how quickly and efficiently the information may be processed, stored, or communicated. The variations in information handling systems allow information handling systems to be general or configured for a specific user or specific use such as financial transaction processing, airline reservations, enterprise data storage, or global communications. In addition, information handling systems may include a variety of hardware and software resources that may be configured to process, store, and communicate information and may include one or more computer systems, graphics interface systems, data storage systems, networking systems, and mobile communication systems. Information handling systems may also implement various virtualized architectures. Data and voice communications among information handling systems may be via networks that are wired, wireless, or some combination.

SUMMARY

An information handling system includes a memory array and a memory controller. The memory array may store data within the information handling system. The memory controller may write the data to the memory array. The memory controller also may determine whether a temperature of the memory array is above a threshold temperature. The memory controller may tag a plurality of memory locations within the memory array written with data while the temperature of the array is above the threshold temperature. While a refresh operation is being executed, the memory controller may determine whether the temperature of the memory array is below the threshold temperature. In response to the temperature of the memory array being below the threshold temperature and while the refresh operation is being executed, the memory controller may rewrite the data in the tagged memory locations within the memory array.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
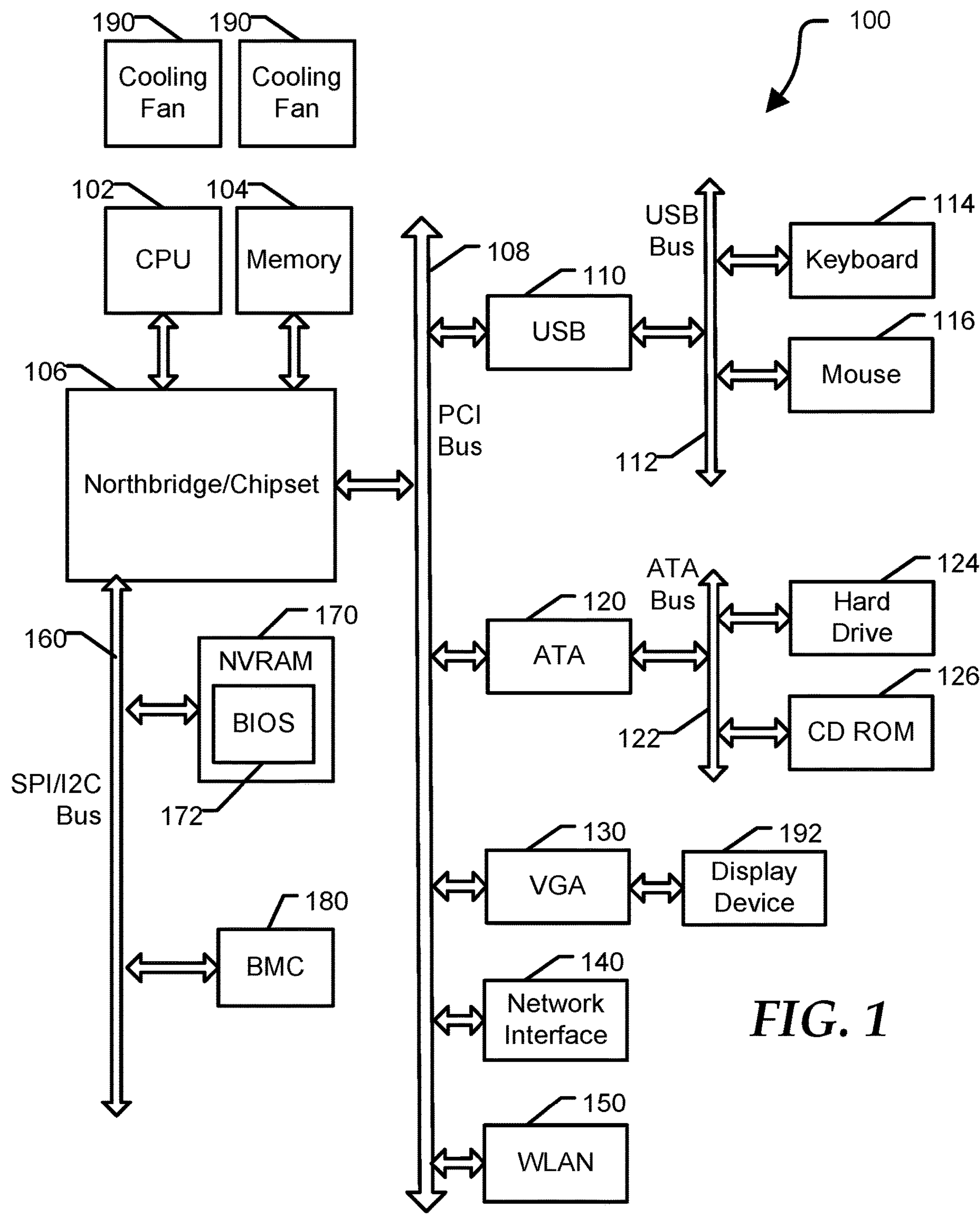
FIG. 1 is a block diagram of a general information handling system according to at least one embodiment of the disclosure.

FIG. 1 illustrates a general information handling system 100 including a processor 102, a memory 104, a northbridge/chipset 106, a PCI bus 108, a universal serial bus (USB) controller 110, a USB bus 112, a keyboard device controller 114, a mouse device controller 116, a configuration an ATA bus controller 120, an ATA bus 122, a hard drive device controller 124, a compact disk read only memory (CD ROM) device controller 126, a video graphics array (VGA) device controller 130, a network interface controller (NIC) 140, a wireless local area network (WLAN) controller 150, a serial peripheral interface (SPI) bus 160, a NVRAM 170 for storing BIOS 172, a baseboard management controller (BMC) 180, and one or more cooling fans 190. In an embodiment, information handling system 100 may be information handling system 200 of FIG. 2. BMC 180 can be referred to as a service processor or embedded controller (EC). Capabilities and functions provided by BMC 180 can vary considerably based on the type of information handling system. For example, the term baseboard management system is often used to describe an embedded processor included at a server, while an embedded controller is more likely to be found in a consumer-level device. As disclosed herein, BMC 180 represents a processing device different from CPU 102, which provides various management functions for information handling system 100. For example, an embedded controller may be responsible for power management, cooling management, and the like. An embedded controller included at a data storage system can be referred to as a storage enclosure processor. Cooling fans 190 may provide air flow to the components within information handling 100.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as CPU 102, a programmable logic array (PLA), an embedded device such as a System-on-a-Chip (SoC), or other control logic hardware. Information handling system 100 can also include one or more computer-readable medium for storing machine-executable code, such as software or data.

System 100 can include additional processors that are configured to provide localized or specific control functions, such as a battery management controller. Bus 160 can include one or more busses, including a SPI bus, an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

BIOS 172 can be referred to as a firmware image, and the term BIOS is herein used interchangeably with the term firmware image, or simply firmware. BIOS 172 includes instructions executable by CPU 102 to initialize and test the hardware components of system 100, and to load a boot loader or an operating system (OS) from a mass storage device. BIOS 172 additionally provides an abstraction layer for the hardware, such as a consistent way for application programs and operating systems to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device.

Information handling system 100 can include additional components and additional buses, not shown for clarity. For example, system 100 can include multiple processor cores, audio devices, and the like. While a particular arrangement of bus technologies and interconnections is illustrated for the purpose of example, one of ordinary skilled in the art will appreciate that the techniques disclosed herein are applicable to other system architectures. System 100 can include multiple CPUs and redundant bus controllers. One or more components can be integrated together. For example, portions of northbridge/chipset 106 can be integrated within CPU 102. Additional components of information handling system 100 can include one or more storage devices that can store machine-executable code, one or more communications ports for communicating with external devices, and various input and output (I/O) devices, such as a keyboard, a mouse, and a video display. For example, device controller 130 may provide data to a display device 192 to visually present the information to an individual associated with information handling system 100. An example of information handling system 100 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media.

Figure 2:
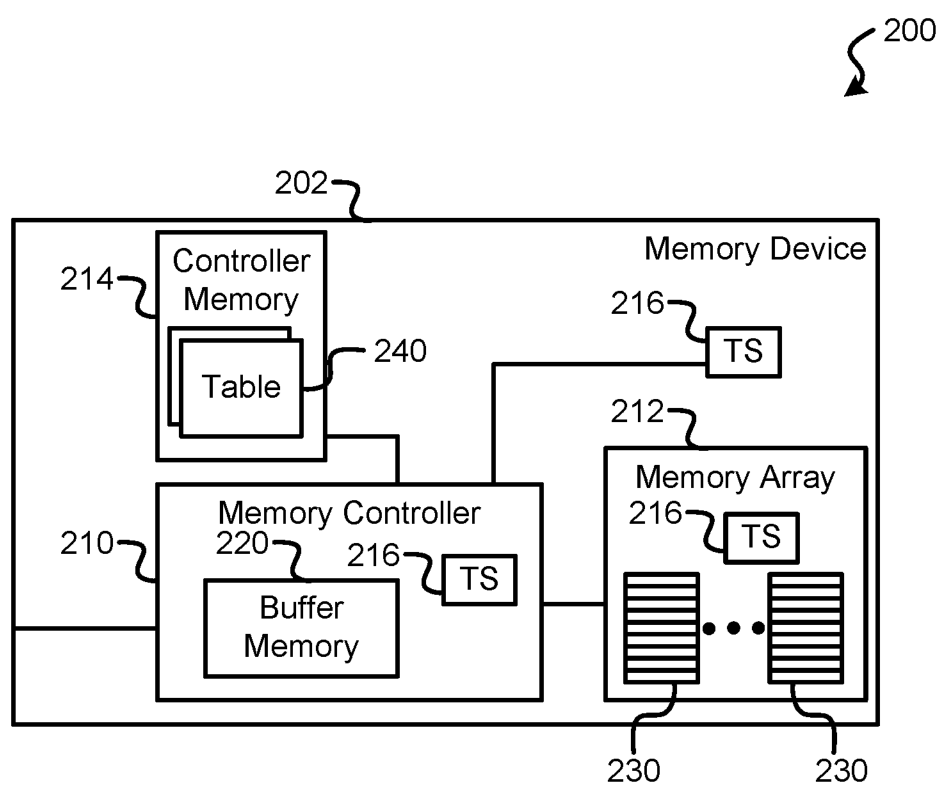
FIG. 2 is a block diagram of a portion of an information handling system according to at least one embodiment of the disclosure.

FIG. 2 shows a portion of an information handling system 200 including a memory device 202. In an example, memory device 202 may be any suitable type of memory device including, but not limited to a solid state nonvolatile memory device. In certain examples, memory device 202 may be configured as a solid state drive (SDD) to store information during operation of information handling system 200. Memory device 202 includes a memory controller 210, a memory array or package 212, a controller memory 214, and one or more thermal sensors 216. In an example, memory controller 210 includes a buffer memory 220, memory array 212 includes multiple memory elements 230, and controller memory 214 includes one or more tables 240.

In an example, buffer memory 220 may temporarily store data to be written to memory elements 230 of memory array 212. In certain examples, memory elements 230 may be any suitable memory element including, but not limited to, flash memory elements or flash memory chips. Each of memory elements 230 may be utilized as memory locations for data within information handling system 200. In an example, information handling system 200 may include additional components without varying from the scope of the disclosure. In certain examples, information handling system 200 may be implemented within any suitable information handling system including, but not limited to, information handling system of FIG. 1.

Memory controller 210 may receive the data to be written to memory elements 230 of memory array 212 from any suitable component via any suitable data bus. For example, data may be written to and read back by a host programmable integrated circuit across any suitable data bus including, but not limited to, a high speed PCIe 3.0 bus, a serial advanced technology attachment (SATA), and a serial attached SCSI (SAS) via a bus interface. In an example, memory controller 210 may be any suitable programmable integrated circuit including, but not limited to, a microprocessor, a microcontroller, an application-specific integrated circuit (ASIC), and a field programmable gate array (FPGA). In certain examples, controller memory may be any suitable type of memory including, but not limited to a non-volatile flash memory. Table 240 may be any suitable table that may store data used by memory controller 210 to control reads to and writes from memory elements 230 of memory array 208. For example, a table 240 may be a flash translation layer (FTL) table utilized by memory controller 210 to manage migration of data from buffer memory 220 to memory elements 230. In an example, memory device 202 may be a NAND memory device.

Thermal sensors 216 may be located in any suitable location of memory device 202 including, but not limited to, a thermal sensor 216 within memory device board, a thermal sensor 216 located in memory controller 216, and a thermal sensor 216 located in memory array or package 212. In an example, memory device 202 may include additional thermal sensors without varying from the scope of this disclosure. Memory controller 210 may receive thermal telemetry data from thermal sensors 216 via any suitable manner including, but not limited to, an in-band communication channel, an out-of-band communication channel, and a side-band communication channel.

During operation, memory controller 210 may write data from buffer memory 220 to memory elements 230 via any suitable manner. For example, memory controller 210 may write to a particular memory location by programming a threshold voltage (Vt) in the memory cell at a physical location within memory array 212 that is associated with a logical address for that particular memory location. However, depending on the temperature of memory array 212, the threshold voltage may be shifted up or down as shown in FIG. 3.

Figure 3:
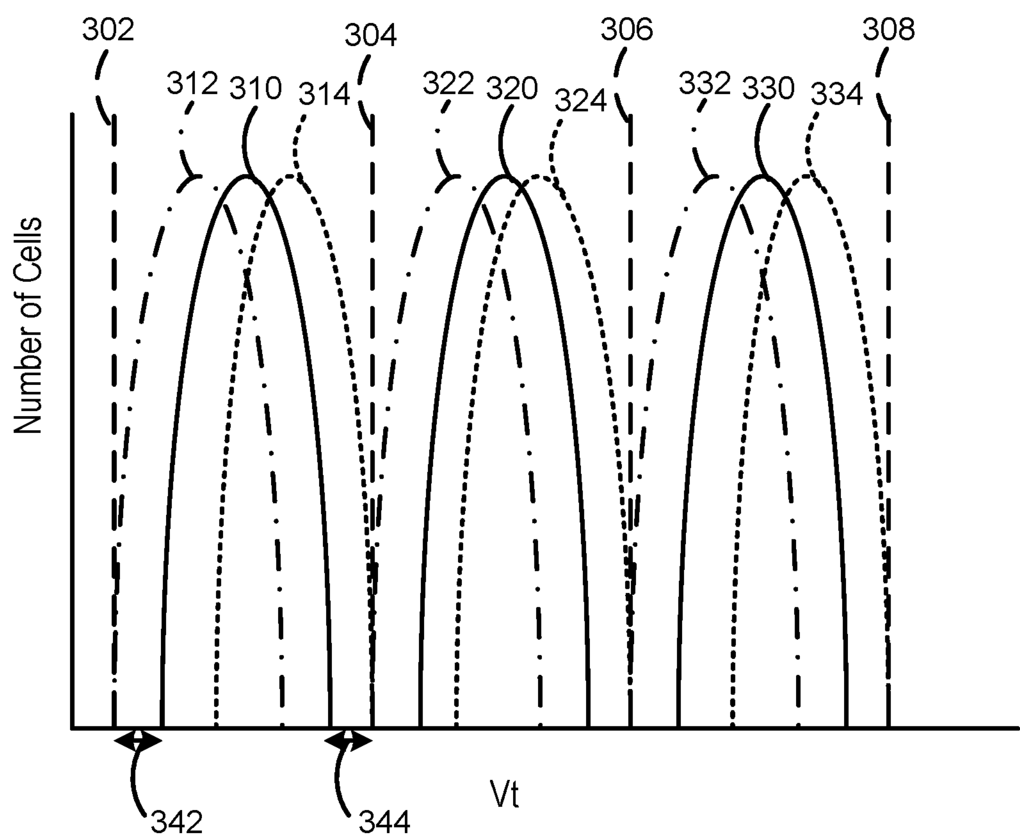
FIG. 3 is a diagram illustrating multiple threshold voltages for memory cells according to at least one embodiment of the disclosure.

FIG. 3 shows a plurality of threshold voltages for memory cells within different voltage ranges according to at least one embodiment of the disclosure. For example, a first voltage range may be between a first voltage indicated by line 302 and a second voltage indicated by line 304, a second voltage range may be between the second voltage indicated by line 304 and a third voltage indicated by line 306, and a third voltage range may be between the third voltage indicated by line 306 and a fourth voltage indicated by line 308. In an example, during a normal programming a threshold voltage may be within curve 310 of the first voltage range, within curve 320 of the second voltage range, or within curve 330 of the third voltage range. In certain examples, the memory element, such as memory element 230 of FIG. 2, may include margins between the desired threshold voltage and the edges of the voltage range. For example, threshold voltages associated with curve 310 may be designed to not approach the limits of the voltage range by margins 342 and 344. In certain examples, threshold voltages within the second and third voltage ranges may include similar margins.

In an example, as a temperature of the memory elements changes the level of the programmed threshold voltage also changes. For example, if the temperature of the memory element associated with the first voltage range increases, the programmed threshold voltage may change from curve 310 to curve 312. If the temperature of the memory element associated with the first voltage range decreases, the programmed threshold voltage may change from curve 310 to curve 314. Similarly, if the temperature of the memory element associated with the second voltage range increases, the programmed threshold voltage may change from curve 320 to curve 322. If the temperature of the memory element associated with the second voltage range decreases, the programmed threshold voltage may change from curve 320 to curve 324.

Figure 4:
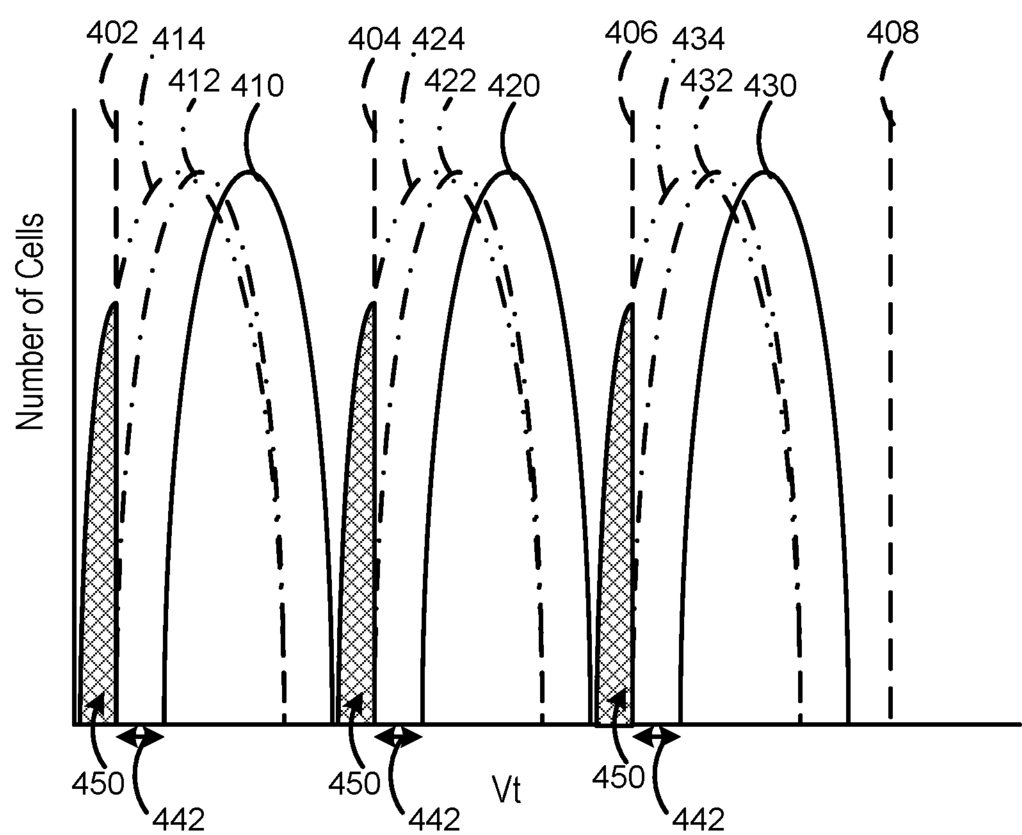
FIG. 4 is a diagram illustrating another set of threshold voltages for memory cells according to at least one embodiment of the disclosure.

Additionally, if the temperature of the memory element associated with the third voltage range increases, the programmed threshold voltage may change from curve 330 to curve 332. If the temperature of the memory element associated with the third voltage range decreases, the programmed threshold voltage may change from curve 330 to curve 334. Thus, the margins, such as margins 342 and 344 may be designed to enable the programmed voltage to remain within the desired voltage range even with changes in the temperature of the memory element. However, if the temperature of the memory element exceeds a threshold temperature, the programmed threshold voltage may shift beyond the designed margins as shown in FIG. 4. In an example, the threshold temperature may be any suitable temperature including in the range of about 85° C.

FIG. 4 shows a diagram illustrating another plurality of threshold voltages for memory cells according to at least one embodiment of the disclosure. For example, a first voltage range may be between a first voltage indicated by line 402 and a second voltage indicated by line 404, a second voltage range may be between the second voltage indicated by line 404 and a third voltage indicated by line 406, and a third voltage range may be between the third voltage indicated by line 406 and a fourth voltage indicated by line 408. In an example, during a normal programming a threshold voltage may be within curve 410 of the first voltage range, within curve 420 of the second voltage range, or within curve 430 of the third voltage range. In certain examples, the memory element, such as memory element 230 of FIG. 2, may include margins between the desired threshold voltage and the edges of the voltage range. For example, threshold voltages may be designed to not approach the limits of the voltage ranges as shown by margins 442.

In an example, as a temperature of the memory elements changes the level of the programmed threshold voltage also changes. For example, if the temperature of the memory element associated with the first voltage range increases, the programmed threshold voltage may change from curve 410 to curve 412. Similarly, if the temperature of the memory element associated with the second voltage range increases, the programmed threshold voltage may change from curve

420 to curve 422. Also, if the temperature of the memory element associated with the third voltage range increases, the programmed threshold voltage may change from curve 430 to curve 432.

However, if the temperature of the memory element exceeds a threshold temperature the programmed threshold voltage may increase even more. In an example, when the temperature of the memory element exceeds the threshold temperature, the programmed threshold voltage of the first voltage range may shift as indicated by curve 414. Similarly, the programmed threshold voltage of the second voltage range may shift as indicated by curve 424. Also, the programmed threshold voltage of the third voltage range may shift as indicated by curve 434. In these examples, the programmed threshold voltage of curves 414, 424, and 434 may cause fail-bits as indicated by the shaded regions 450. In an example, memory elements with programmed threshold voltages within regions 450 may not be read as having the correct programmed data.

Referring back to FIG. 2, previous memory devices implemented self-managing throttle mechanisms to avoid programming or dwelling memory elements beyond the threshold temperature. Additionally, previous memory devices may also implement dynamic threshold voltage read adjustments for reading the charged cell correctly. However, there is still valid risk of thermal excursion events due to the external temperature that cannot be controlled, which may result in a memory device losing user data with fail-bits that cannot be recovered by current solutions. Thus, memory controller 210 may improve an information handling system, such as information handling system 200, by identifying when data is written to a memory element having a thermal excursion event and rewriting the data to ensure that the correct data is stored. In an example, a thermal excursion event is an event when a temperature of the memory element exceeds the threshold temperature while data is being written.

During operation, memory controller 210 may continually monitor the temperature of memory array 212, and thus the temperature of memory elements 230, via one or more of thermal sensors 216. In an example, the temperature of memory elements 230 may be monitored at any suitable level of granularity. For example, memory controller 210 may monitor, via thermal sensor 216, the temperature of memory elements 230 at a page level. While memory controller 210 is monitoring the temperature of memory elements 230 within memory array 212, the memory controller may perform one or more operations to write data to memory locations of the memory array. For example, memory controller 210 may utilize one of tables 240 in controller memory 214 to perform logical address to physical address translation to map a logical address from a processor to a physical address of memory array 212. However, if the temperature of memory element 230 exceeds the threshold temperature while memory controller 210 is writing data to the memory elements of memory array 212, the memory controller may tag the memory location associated with the data written while the temperature is exceeding the threshold temperature.

In an example, memory controller 210 may perform one or more suitable operations to tag the programmed cell or memory location when the temperature exceeds the threshold temperature. For example, memory controller 210 may store data within metadata for the memory location indicating that the data was written while the temperature exceeded the threshold temperature. In an example, memory controller 210 may set a field within a journal of table 240 in controller memory 214 to indicate that data was written to the memory location associated with the field while the temperature exceeded the threshold temperature. In certain examples, the journal of table 240 may include entries for every write performed by memory controller 210 and the field may include a bit that is set to a first state if the temperature exceeds the threshold temperature when the data is written, and is set to a second state if the temperature does not exceed the threshold temperature when the data is written.

During idle periods, memory controller 210 may perform one or more operations to free memory space within memory array 212. In an example, the one or more operations may include a refresh operation, such as garbage collection. In an example, garbage collection operations may include memory controller 210 rewriting one or more pages of good data from a block of memory elements 230 that also includes stale data to another block that includes all free pages, and the memory controller may then erase the data from all of pages in the original block to free the pages in that block for writing of data. In another example, a refresh operation may also include when a capacity of buffer memory 220 has exceeded a threshold capacity, such that some data may need to be flushed from the buffer memory to enable new data to be temporarily stored within the buffer memory.

In an example, during the refresh operations, such as garbage collection or flushing of buffer memory 220, memory controller 210 may determine whether the temperature of memory elements 230 within memory array 212 is below the threshold temperature. If so, memory controller 210 may determine data written to one or more tagged memory locations. In response to one or more memory locations being tagged, memory controller 210 may perform any suitable operation to rewrite the data to memory elements 230 of memory array 212 to preserve the data before a failure occurs within the memory array. For example, memory controller 210 may write the data in buffer memory 220 associated with the tagged memory locations to memory elements 230. In certain examples, memory controller 210 may then update table 240 to map the logical address for the data to the new physical address in memory array 212. Memory controller 210 may also perform one or more operations to remove the tag from the tagged memory locations. For example, memory controller 210 may rewrite the metadata for the memory locations, may updated the associated fields to the second state in the journal of table 240, or the like. Thus, memory controller 210 may improve information handling system 200 by tagging memory locations written during thermal excursions and rewriting the data associated with the tagged memory locations during refresh operations when the temperature of memory array 212 is below the threshold temperature.

Figure 5:
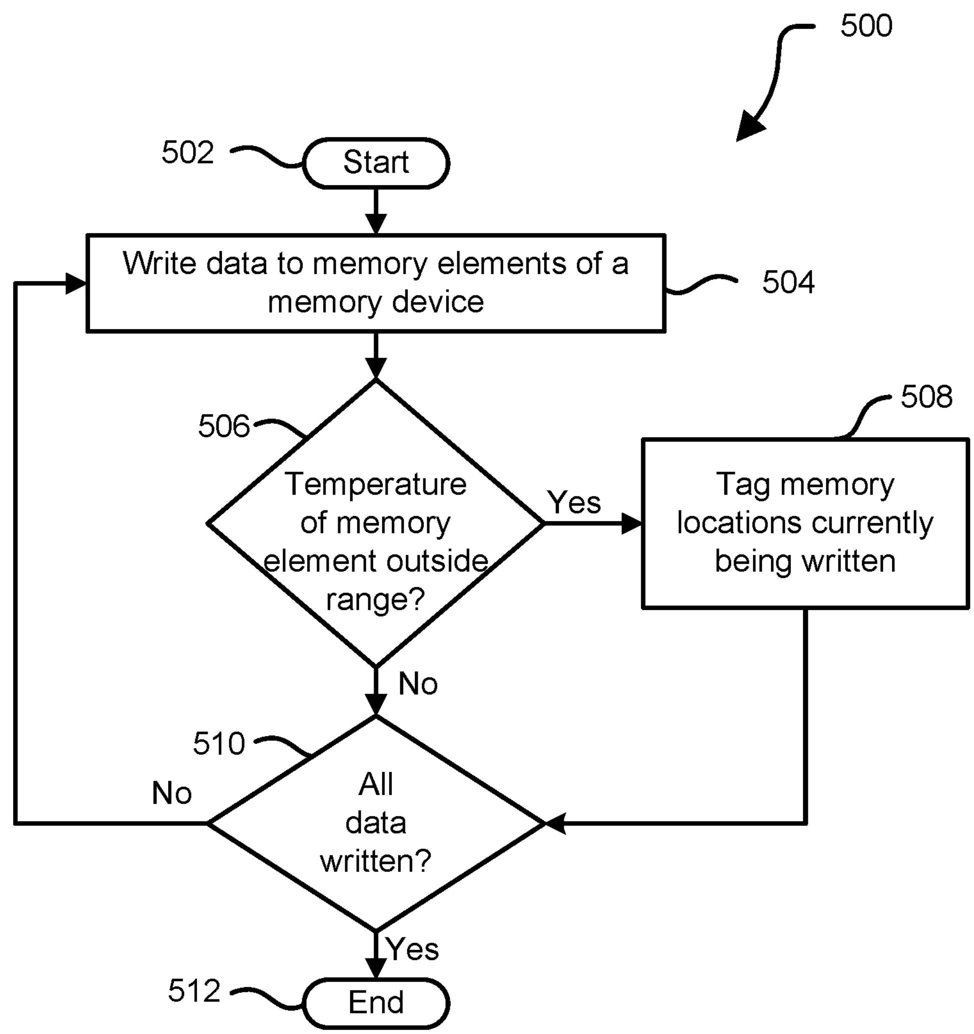
FIG. 5 is a flow diagram illustrating a method for identifying a thermal excursion event within a memory array according to at least one embodiment of the disclosure.

FIG. 5 shows a method for identifying a thermal excursion event within a memory array according to at least one embodiment of the disclosure, starting at block 502. It will be readily appreciated that not every method step set forth in this flow diagram is always necessary, and that certain steps of the methods may be combined, performed simultaneously, in a different order, or perhaps omitted, without varying from the scope of the disclosure. FIG. 5 may be employed in whole, or in part, by information handling system 100 depicted in FIG. 1, information handling system 200 described in FIG. 2, or any other type of system, controller, device, module, processor, or any combination thereof, operable to employ all, or portions of, the method of FIG. 5.

At block 504, data is written to memory elements of a memory device within an information handling system. In an example, the data may be written to one or more memory locations of the memory elements by a memory controller of the information handling system.

At block 506, a determination is made whether a temperature of the memory element exceeds a threshold temperature. In an example, the memory controller may receive the temperature of the memory elements as thermal telemetry data from a thermal sensor of a memory device within the information handling system. In certain examples, the thermal sensor may be located in any suitable location including, but not limited to, within memory device board, within a memory controller package, and within a memory array package.

If the temperature exceeds the threshold temperature, memory locations with data current being written are tagged at block 508, and the flow continues at block 510. In an example, the memory controller may perform one or more suitable operations to tag the memory locations when the temperature exceeds the threshold temperature. For example, the memory controller may store data within the metadata for the memory location indicating that the data was written while the temperature exceeded the threshold temperature. In another example, the memory controller may set a field within a journal of table in a controller memory to indicate that data was written to the memory location associated with the field while the temperature exceeded the threshold temperature. In certain examples, the journal may include entries for every write performed by the memory controller and the field may include a bit that is set to a first state if the temperature exceeds the threshold temperature when the data is written, and is set to a second state if the temperature does not exceed the threshold temperature when the data is written.

If the temperature does not exceed the threshold temperature, a determination is made whether all data is written at block 510. If not all of the data has been written, the flow continues as stated above at block 504. Otherwise, if all of the data has been written, the method ends at block 512.

Figure 6:
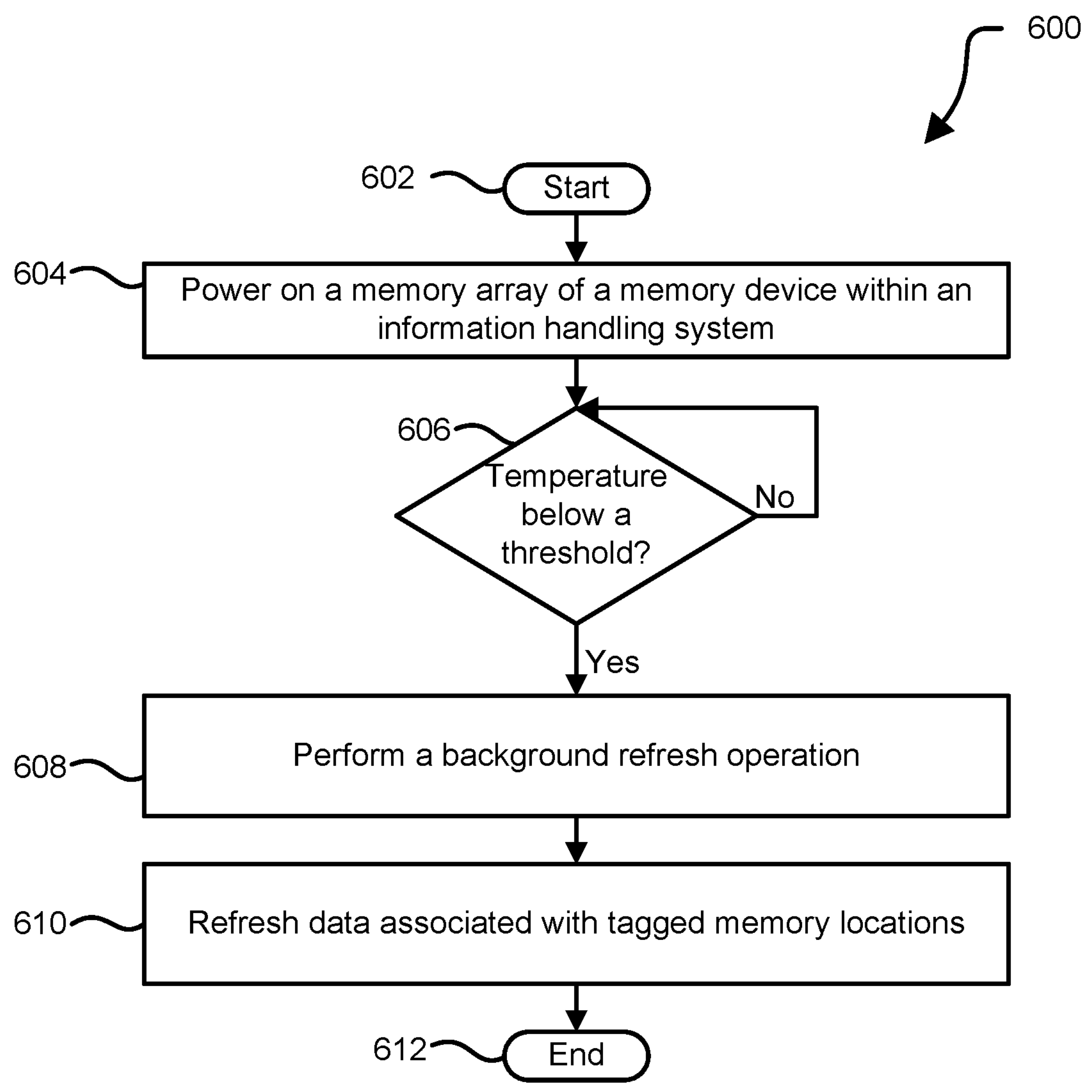
FIG. 6 is a flow diagram illustrating a method for refreshing data within a memory array in response to a thermal excursion event according to at least one embodiment of the disclosure.

FIG. 6 shows a method for refreshing data within a memory array in response to a thermal excursion event according to at least one embodiment of the disclosure, starting at block 602. It will be readily appreciated that not every method step set forth in this flow diagram is always necessary, and that certain steps of the methods may be combined, performed simultaneously, in a different order, or perhaps omitted, without varying from the scope of the disclosure. FIG. 6 may be employed in whole, or in part, by information handling system 100 depicted in FIG. 1, information handling system 200 described in FIG. 2, or any other type of system, controller, device, module, processor, or any combination thereof, operable to employ all, or portions of, the method of FIG. 6.

At block 604, a memory array of a memory device is powered on. At block 606, a determination is made whether the temperature of the memory elements is below a threshold temperature. In response to the temperature being below the threshold temperature, a background refresh operation is performed at block 608. In an example, the background refresh operation may include any suitable operation including, but not limited to, garbage collection. In another example, a refresh operation may also include when a capacity of a buffer memory has exceeded a threshold capacity, such that some data may need to be flushed from the buffer memory to enable new data to be temporarily stored within the buffer memory.

At block 610, data associated with tagged memory locations is refreshed, and the method ends at block 612. In an example, a tagged memory location may be a memory location that had data written to it while the temperature of the memory element exceeded the threshold temperature.

Figure 7:
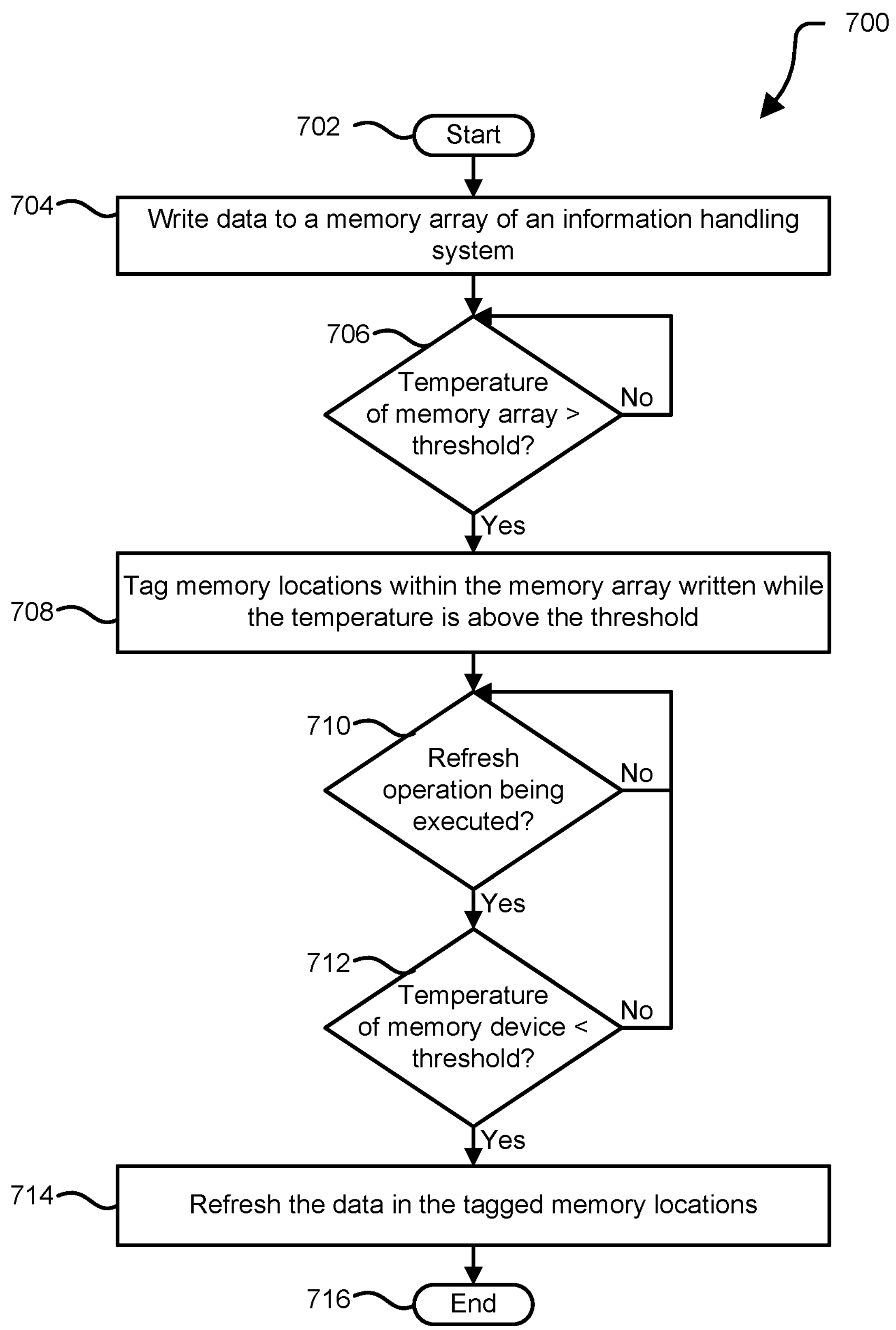
FIG. 7 is a flow diagram illustrating a method for identifying a thermal excursion event and refreshing data within a memory array in response to the thermal excursion event according to at least one embodiment of the disclosure.

FIG. 7 shows a method for identifying a thermal excursion event and refreshing data within a memory array in response to the thermal excursion event according to at least one embodiment of the disclosure, starting at block 702. It will be readily appreciated that not every method step set forth in this flow diagram is always necessary, and that certain steps of the methods may be combined, performed simultaneously, in a different order, or perhaps omitted, without varying from the scope of the disclosure. FIG. 7 may be employed in whole, or in part, by information handling system 100 depicted in FIG. 1, information handling system 200 described in FIG. 2, or any other type of system, controller, device, module, processor, or any combination thereof, operable to employ all, or portions of, the method of FIG. 7.

At block 704, data is written to a memory array of a memory device within an information handling system. In an example, the data may be written to one or more memory locations of the memory array by a memory controller of the information handling system.

At block 706, a determination is made whether a temperature of the memory element exceeds a threshold temperature. In an example, the memory controller may receive the temperature of the memory elements as thermal telemetry data from a thermal sensor of a memory device within the information handling system. In certain examples, the thermal sensor may be located in any suitable location including, but not limited to, within memory device board, within a memory controller package, and within a memory array package.

If the temperature exceeds the threshold temperature, memory locations with data currently being written are tagged at block 708. In an example, the memory controller may perform one or more suitable operations to tag the memory locations when the temperature exceeds the threshold temperature. For example, the memory controller may store data within the metadata for the memory location indicating that the data was written while the temperature exceeded the threshold temperature. In another example, the memory controller may set a field within a journal of table in a controller memory to indicate that data was written to the memory location associated with the field while the temperature exceeded the threshold temperature. In certain examples, the journal may include entries for every write performed by the memory controller and the field may include a bit that is set to a first state if the temperature exceeds the threshold temperature when the data is written, and is set to a second state if the temperature does not exceed the threshold temperature when the data is written.

At block 710, a determination is made whether a refresh operation is being performed. In an example, the refresh operation may include any suitable operation including, but not limited to, garbage collection. In another example, the refresh operation may also include when a capacity of a buffer memory has exceeded a threshold capacity, such that some data may need to be flushed from the buffer memory to enable new data to be temporarily stored within the buffer memory. While the refresh operation is being performed, a determination is made whether the temperature of the memory array is below the threshold temperature at block 712. If the temperature is not below the threshold temperature, the flow continues as stated above at block 710. In response to the temperature being below the threshold temperature, data associated with tagged memory locations is refreshed at block 714, and the method ends at block 716.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random access memory or other volatile re-writable memory. Additionally, the computer-readable medium may include a magneto-optical or optical medium, such as a disk or tapes or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module may include software, including firmware embedded at a processor or software capable of operating a relevant environment of the information handling system. The device or module may also include a combination of the foregoing examples of hardware or software. Note that an information handling system may include an integrated circuit or a board-level product having portions thereof that may also be any combination of hardware and software.

Devices, modules, resources, or programs that are in communication with one another need not be in continuous communication with each other, unless expressly specified otherwise. In addition, devices, modules, resources, or programs that are in communication with one another may communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system, comprising:
- a memory array of a memory device, the memory array to store data within the information handling system;
- a memory buffer to temporary store the data for the memory array; and
- a memory controller to communicate with the memory array, the memory controller to:
- write the data to the memory array;
- determine whether a temperature of the memory array is above a threshold temperature;
- tag a plurality of memory locations within the memory array written with data while the temperature is above the threshold temperature; and
- determine whether a capacity of the memory buffer is above a threshold capacity, wherein the memory buffer is located within the memory controller;
- in response to the capacity of the memory buffer is above the threshold capacity, execute a refresh operation; and
- while the refresh operation is being executed, the memory controller to:
  - determine whether the temperature of the memory array is below the threshold temperature; and
  - in response to the temperature of the memory array being below the threshold temperature, rewrite the data in the tagged memory locations within the memory array.

2. The information handling system of claim 1, further comprising:
- a thermal sensor associated with the memory array,
- wherein prior to determination of whether the temperature of the memory array is above the threshold temperature, the memory controller to receive the temperature of the memory array from the thermal sensor.

3. The information handling system of claim 2, wherein the thermal sensor is located at one of a plurality of locations including within a board including the memory controller and memory array, within a memory controller package, and within a memory array package.

4. The information handling system of claim 1, wherein the tagging of the memory locations includes the memory controller further to:
- store metadata for the memory locations indicating that the data was written while the temperature was above the threshold temperature.

5. The information handling system of claim 1, wherein in response to the refresh operation being completed, the memory controller to flush at least a portion of the memory buffer.

6. The information handling system of claim 1, wherein the tagging of the memory locations includes the memory controller further to:
- set a plurality of fields within a controller memory, wherein each of the fields is associated with a different one of the memory locations written while the temperature was above the threshold temperature.

7. The information handling system of claim 1, wherein the memory controller further to:
- determine whether a garbage collection operation is being executed; and in response to the garbage collection operation being executed, determine that the refresh operation is being executed.

8. A method, comprising:

writing, by a memory controller of an information handling system, data to a memory array of the information handling system;

determining, by the memory controller, whether a temperature of the memory array is above a threshold temperature;

tagging a plurality of memory locations within the memory array written with data while the temperature is above the threshold temperature;

determining whether a capacity of a memory buffer is above a threshold capacity, wherein the memory buffer is located within the memory controller;

in response to the capacity of the memory buffer being above the threshold capacity, executing a refresh operation; and while the refresh operation is being executed, rewriting the data in the tagged memory locations within the memory array if the temperature of the memory array is below the threshold temperature.

9. The method of claim 8, wherein the tagging of the memory locations further comprises:

storing metadata for the memory locations indicating that the data was written while the temperature was above the threshold temperature.

10. The method of claim 8, wherein the tagging of the memory locations further comprises:

setting a plurality of fields within a controller memory, wherein each of the fields is associated with a different one of the memory locations written while the temperature was above the threshold temperature.

11. The method of claim 8, further comprising:

determining whether a garbage collection operation is being executed; and in response to the garbage collection operation being executed, determining that the refresh operation is being executed.

12. The method of claim 8, further comprising:

in response to the refresh operation being completed, flushing at least a portion of the memory buffer.

13. The method of claim 8, further comprising:

prior to the determining of whether the temperature of the memory array is above the threshold temperature, receiving, by the memory controller, the temperature of the memory array from a thermal sensor associated with the memory array.

14. The method of claim 8, wherein the memory array is a flash memory array.

15. An information handling system, comprising:

a memory array of a memory device, the memory array to store data within the information handling system;

a thermal sensor to measure temperatures associated with the memory array;

a memory buffer to temporary store the data for the memory array; and a memory controller to;

write the data to the memory array;

receive, from the thermal sensor, a temperature of the memory array;

determine whether the temperature of the memory array is above a threshold temperature;

tag a plurality of memory locations within the memory array written with data while the temperature is above the threshold temperature;

determine whether a capacity of the memory buffer is above a threshold capacity, wherein the memory buffer is located within the memory controller;

in response to the capacity of the memory buffer being above the threshold capacity, execute a refresh operation; and while the refresh operation is being executed and if the temperature of the memory array is below the threshold temperature, then rewrite the data in the tagged memory locations within the memory array, wherein the data is stored in the memory buffer to be flushed during the refresh operation.

16. The information handling system of claim 15, wherein the tagging of the memory locations includes the memory controller further to:

store metadata for the memory locations indicating that the data was written while the temperature was above the threshold temperature.

17. The information handling system of claim 15, wherein the tagging of the memory locations includes the memory controller further to:

set a plurality of fields within a controller memory, wherein each of the fields is associated with a different one of the memory locations written while the temperature was above the threshold temperature.

18. The information handling system of claim 15, wherein the memory controller further to:

determine whether a garbage collection operation is being executed; and in response to the garbage collection operation being executed, determine that the refresh operation is being executed.

* * * * *